(12) United States Patent
Balan et al.

(10) Patent No.: US 11,665,029 B2
(45) Date of Patent: May 30, 2023

(54) FEED FORWARD FILTER EQUALIZER ADAPTATION USING A CONSTRAINED FILTER TAP COEFFICIENT VALUE

(71) Applicant: NVIDIA Corporation, Santa Clara, CA (US)

(72) Inventors: Vishnu Balan, Saratoga, CA (US); Pervez Mirza Aziz, Dallas, TX (US); Guo Hau Gau, Zhubei (TW)

(73) Assignee: NVIDIA Corporation, Santa Clara, CA (US)

( * ) Notice: Subject to any disclaimer, the term of this patent is extended or adjusted under 35 U.S.C. 154(b) by 3 days.

(21) Appl. No.: 17/365,620

(22) Filed: Jul. 1, 2021

(65) Prior Publication Data

US 2023/0006867 A1    Jan. 5, 2023

(51) Int. Cl.
*H04L 25/06*   (2006.01)
*H04L 25/03*   (2006.01)
(Continued)

(52) U.S. Cl.
CPC ........ *H04L 25/062* (2013.01); *H03M 1/0626* (2013.01); *H03M 1/186* (2013.01);
(Continued)

(58) Field of Classification Search
None
See application file for complete search history.

(56) References Cited

U.S. PATENT DOCUMENTS 6,449,586 B1 * 9/2002 Hoshuyama ....... H03H 21/0001
                                                        381/92
6,563,868 B1 * 5/2003 Zhang ................ H03H 21/0012
                                                        375/232
(Continued)

FOREIGN PATENT DOCUMENTS

CA    2249826 A1 *  4/1999  ........... H04L 7/0062
CA    2274173 C  * 10/2009  ......... H03H 21/0012
(Continued)

OTHER PUBLICATIONS

Ng et al. Adaptive Feed-Forward Filter Equalizer, IEEE 2018 (Year: 2018).*

(Continued)

*Primary Examiner* — Berhanu Tadese
(74) *Attorney, Agent, or Firm* — Lowenstein Sandler LLP

(57) ABSTRACT

A feed forward equalizer including a first set of filter taps having a first set of filter tap coefficients to be adapted and a second set of one or more filter taps having one or more filter tap coefficients to be constrained. The feed forward equalizer includes an adaptation component to determine a set of adapted filter tap coefficient values corresponding to the first set of filter tap coefficients and a constraint function component to determine a constrained filter tap coefficient value for the second set of the one or more filter taps having the one or more filter tap coefficients to be constrained using a constraint function based on at least a portion of the set of adapted filter tap coefficient values. The feed forward equalizer generates, based at least in part on the constrained filter tap coefficient value, an equalized signal including a set of estimated symbol values.

17 Claims, 9 Drawing Sheets

L1 = number of post-cursor taps/coefficients; where L1 = 3
L2 = number of pre-cursor taps/coefficients; where L2 = 3

| Pre-cursor tap coefficients | Post-cursor tap coefficients | Main Tap Coefficient | Set of adapted filter tap coefficients | Constrained filter tap coefficient (key tap coefficient) |
|---|---|---|---|---|
| f(-3), f(-2), f(-1) | f(1), f(2), f(3) | f(0) | f(-3), f(-2), f(-1), f(0), f(2), f(3) | f(1) |

(51) Int. Cl.
*H03M 1/06* (2006.01)
*H03M 1/18* (2006.01)
*H04L 25/02* (2006.01)

(52) U.S. Cl.
CPC ...... *H04L 25/03006* (2013.01); *H04L 25/025* (2013.01); *H04L 25/0258* (2013.01); *H04L 2025/0349* (2013.01)

(56) References Cited

U.S. PATENT DOCUMENTS

| | | | | |
|---|---|---|---|---|
| 7,053,688 | B2 * | 5/2006 | Mukherjee | H04L 25/03885 327/359 |
| 7,231,001 | B2 * | 6/2007 | Aziz | H04L 25/061 327/307 |
| 7,411,531 | B2 * | 8/2008 | Aziz | H03M 1/125 375/376 |
| 7,466,766 | B2 * | 12/2008 | Aziz | H04L 25/061 375/319 |
| 7,831,004 | B2 * | 11/2010 | Imahashi | H04L 25/03343 375/354 |
| 7,961,781 | B2 * | 6/2011 | Telang | H04L 25/03063 375/229 |
| 8,027,409 | B2 * | 9/2011 | Aziz | H04L 25/03057 327/147 |
| 8,615,062 | B2 * | 12/2013 | Chmelar | H04L 25/03057 375/350 |
| 8,838,660 | B2 * | 9/2014 | Liao | G11B 20/10462 708/322 |
| 8,983,223 | B2 * | 3/2015 | Avadhanam | G06T 5/003 382/265 |
| 8,989,254 | B2 * | 3/2015 | Jing | G06F 13/102 375/233 |
| 9,014,313 | B2 * | 4/2015 | Chmelar | H04L 25/03057 375/348 |
| 9,020,022 | B1 * | 4/2015 | Warner | H04L 7/0058 375/232 |
| 9,129,647 | B2 * | 9/2015 | Liao | G11B 20/10046 |
| 9,143,369 | B2 * | 9/2015 | He | H04L 25/03878 |
| 9,313,054 | B1 * | 4/2016 | Liao | H04L 25/03019 |
| 9,521,021 | B2 * | 12/2016 | He | H04L 25/03343 |
| 10,148,469 | B2 * | 12/2018 | Cohen | H04L 7/0062 |
| 10,904,044 | B2 * | 1/2021 | Palusa | H04L 25/03057 |
| 10,911,272 | B2 * | 2/2021 | Palusa | H04L 27/01 |
| 11,240,075 | B2 * | 2/2022 | Palusa | H04L 25/028 |
| 11,398,933 | B2 * | 7/2022 | Palusa | H04L 25/03038 |
| 2006/0082406 | A1 * | 4/2006 | Mukherjee | H04L 25/03885 327/359 |
| 2007/0286318 | A1 * | 12/2007 | Imahashi | H04L 25/03343 375/355 |
| 2009/0161747 | A1 * | 6/2009 | Aziz | H04L 25/03057 375/233 |
| 2012/0158810 | A1 * | 6/2012 | Liao | G11B 20/10055 708/322 |
| 2015/0030257 | A1 * | 1/2015 | Avadhanam | G06T 5/003 382/260 |
| 2015/0179213 | A1 * | 6/2015 | Liao | G11B 5/035 360/65 |
| 2018/0316524 | A1 * | 11/2018 | Cohen | H04L 25/03949 |
| 2020/0412586 | A1 * | 12/2020 | McLoughlin | H04B 10/0775 |
| 2021/0006330 | A1 * | 1/2021 | McLoughlin | H04B 10/0731 |
| 2021/0306187 | A1 * | 9/2021 | Choudhary | H04L 25/03318 |
| 2022/0158878 | A1 * | 5/2022 | Palusa | H04L 25/03885 |

FOREIGN PATENT DOCUMENTS

| | | | | |
|---|---|---|---|---|
| CN | 101938436 A | * | 1/2011 | ....... H04L 25/03057 |
| CN | 102457468 A | * | 5/2012 | ....... H04L 25/03057 |
| EP | 2086158 A1 | * | 8/2009 | ........... H04L 7/0058 |
| EP | 2779551 A2 | * | 9/2014 | ....... H04L 25/03343 |
| EP | 2779551 B1 | * | 12/2015 | ....... H04L 25/03343 |
| EP | 3257208 B1 | * | 7/2019 | ....... H04L 25/03019 |
| IL | 194599 A | * | 11/2014 | ........... H04B 1/1027 |
| JP | 3001092 B2 | * | 1/2000 | |
| JP | 3216704 B2 | * | 10/2001 | ......... H03H 21/0001 |
| JP | 2004288359 A | * | 10/2004 | ........... H04L 25/061 |
| JP | 4348706 B2 | * | 10/2009 | ............. H04M 1/03 |
| JP | 2011008914 A | * | 1/2011 | ........... H04L 25/061 |
| JP | 6678684 B2 | * | 4/2020 | ............. H04L 25/03 |
| WO | WO-0019655 A1 | * | 4/2000 | ....... H04L 25/03019 |
| WO | WO-2004034734 A1 | * | 4/2004 | ............. H04M 1/03 |
| WO | WO-2016130360 A1 | * | 8/2016 | ....... H04L 25/03019 |
| WO | WO-2018204010 A1 | * | 11/2018 | ....... H04L 25/03057 |
| WO | WO-2020036740 A1 | * | 2/2020 | ....... H04L 25/03076 |
| WO | WO-2021108026 A1 | * | 6/2021 | ......... G06F 13/4282 |

OTHER PUBLICATIONS

Du et al., "A Linearly Constrained Adaptive FIR Filter for Hard Disk Drive Read Channels", IEEE Xplore, downloaded Feb. 15, 2021, 5 pages.

* cited by examiner

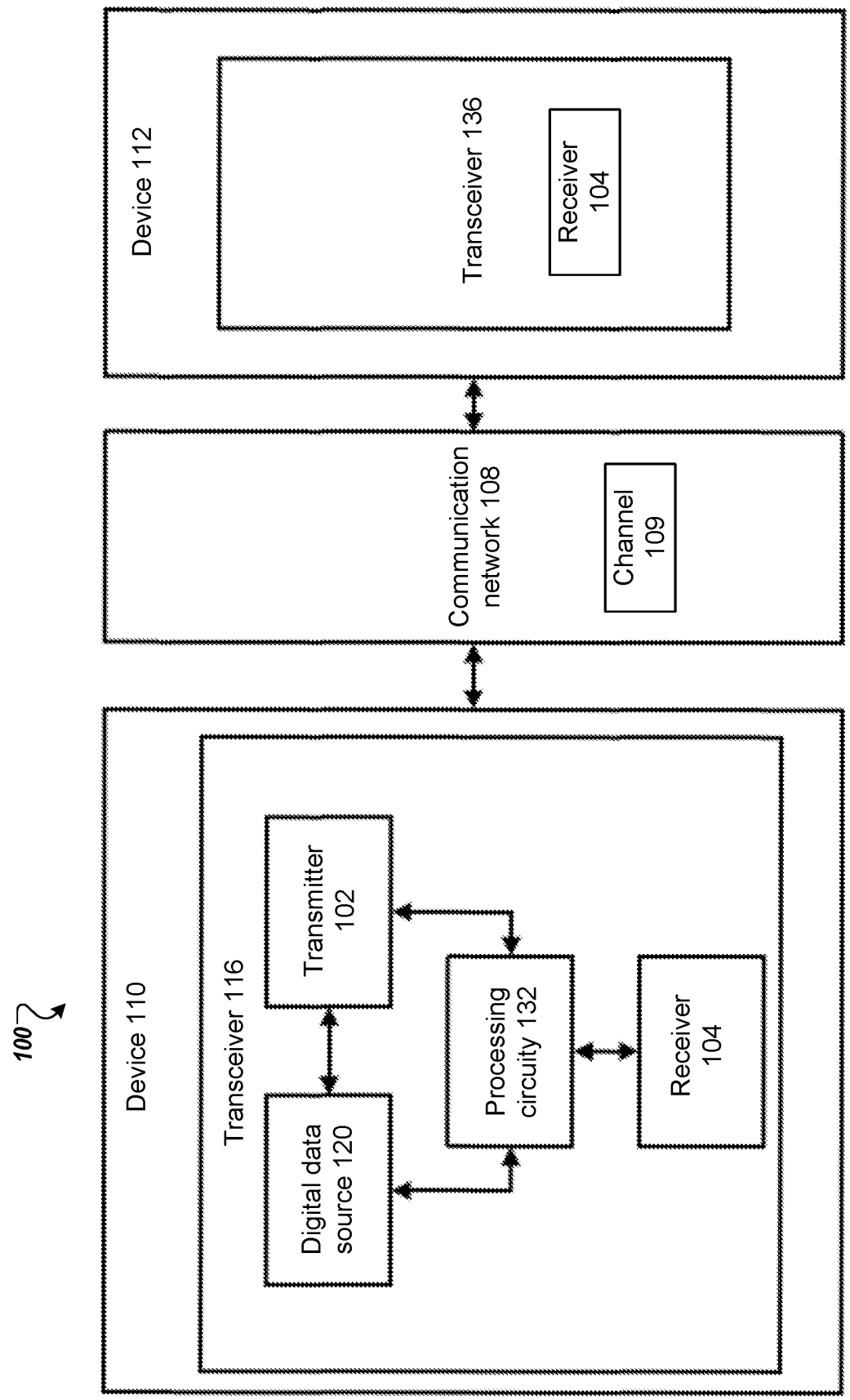

FEED FORWARD FILTER EQUALIZER ADAPTATION USING A CONSTRAINED FILTER TAP COEFFICIENT VALUE

TECHNICAL FIELD

At least one embodiment pertains to processing resources used to perform high-speed communications. For example, at least one embodiment pertains to technology for optimizing a feed forward equalizer (FFE) used in a communication channel to reduce intersymbol interference (ISI).

BACKGROUND

Communication systems employ a modulation scheme (e.g., a pulse amplitude modulation (PAM) scheme such as PAM2, PAM4, PAM8, PAM16, etc.) for the transmission of signals from a transmitter to a receiver via a communication channel or medium (e.g., cables, printed circuit boards, optical fibers, etc.). The use of PAM modulation results in the need for a communication channel to optimize equalization of the signal to achieve a desired bit error ratio (BER). A typical digital signal processing (DSP)-based receiver equalizes a received signal using a receiver (RX) feed forward equalizer (FFE) having a multi-tap adaptive finite impulse response (FIR) filter. The FIR filter of the RX FFE employs multiple taps, each associated with a weight or "filter tap coefficient" to adjust the filter's response to compensate for unknown factors and elements of the communication medium between the transmitter and the receiver.

The RX FFE may employ an adaptation scheme to provide a means to optimize the filter tap coefficients or weights autonomously. This practice is useful not only for unknown channels but also to compensate for variations in device characteristics over time, such as temperature and device aging. The equalization performed by the RX FFE, though needed, can come at the cost of enhancing the noise associated with the data signal. The noise enhancement penalty associated with the equalization performed by a typical RX FFE using conventional adaptation schemes results in an undesired BER. In addition, conventional adaptation schemes may result in less robust adaptation when the RX FFE and clock data recovery (CDR) are jointly adapted.

BRIEF DESCRIPTION OF DRAWINGS

Various embodiments in accordance with the present disclosure will be described with reference to the drawings, in which:

FIG. 1A illustrates an example communication system, in accordance with at least some embodiments.

DETAILED DESCRIPTION

Figure 1B:
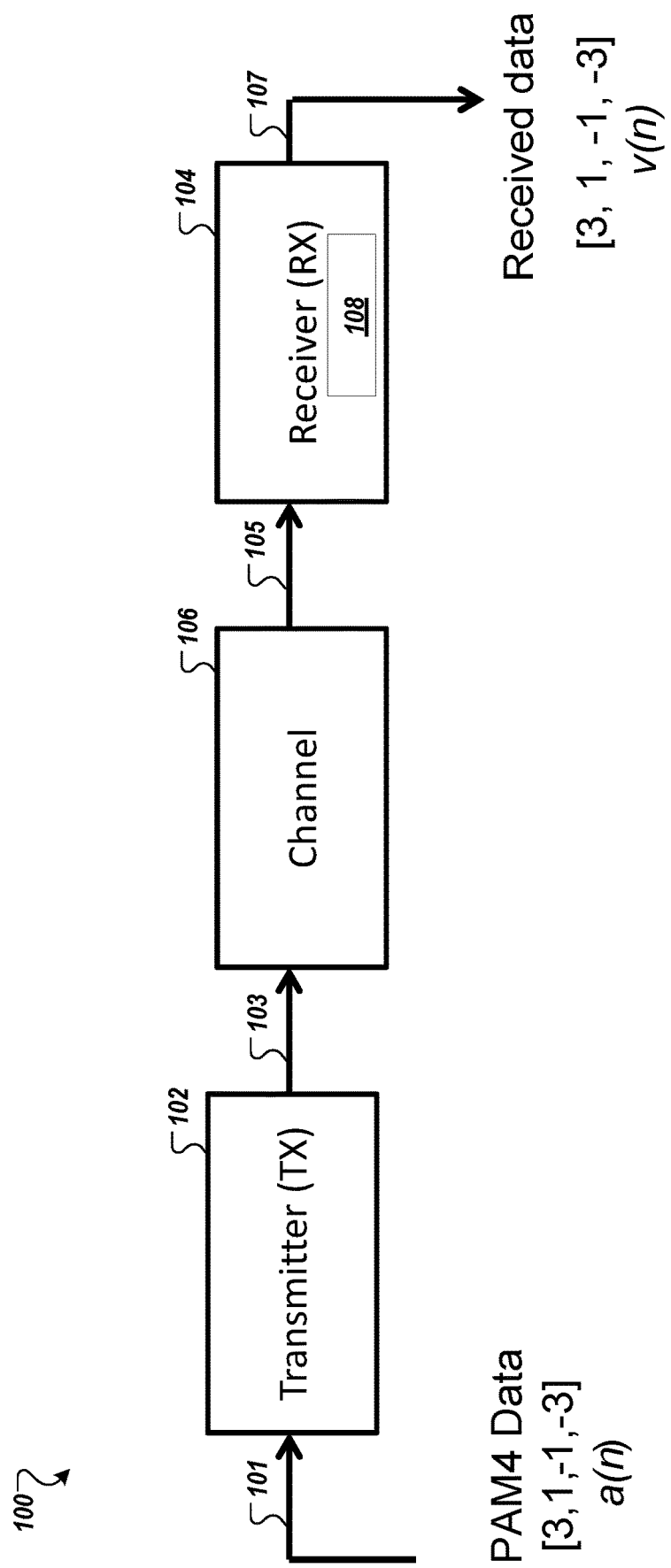
FIG. 1B illustrates a block diagram of an exemplary communication system employing an example modulation scheme, in accordance with at least some embodiments.

As described above, desired BER performance targets cannot be met by a typical feed forward equalizer (FFE) performing noise-enhancing equalization using a multi-tap RX FFE employing a standard adaptation scheme (e.g., a least mean squared (LMS) adaptation scheme or a zero-forcing (ZF) adaptation scheme) that allows all taps except for the "main" tap or cursor tap to adapt. Advantageously, aspects of the present disclosure are directed to a multi-tap RX FFE configured to perform a constrained FFE adaptation to adapt a set of filter tap coefficient values using a first adaptation scheme (e.g., an LMS adaptation scheme, a ZF adaptation scheme, etc.) to produce a set of adapted filter tap coefficient values, where one or more designated or key filter tap coefficient values (also referred to in the singular form as a "designated tap value" or "key tap value") are not adapted using the first adaptation scheme or algorithm. According to embodiments, the RX FFE computes the "constrained" key filter tap coefficient value using a constraint function based on at least a portion of the adapted filter tap coefficient values. The constrained adaptation where the key tap value is not adapted using a first adaptation scheme but instead is computed using the constraint function based on the adapted filter tap coefficient values of other filter taps provides for settled tap values while providing the desired equalization within the frequency bandwidth of interest. The equalization achieved using the constrained adaptation of the present disclosure achieves a roll-off (i.e., low-pass behavior) at frequencies higher than the signal bandwidth, which allows for high-frequency noise to be attenuated to minimize the noise enhancement penalty and achieve an improved better bit error rate. In addition, the constrained adaptation schemes achieves a more robust adaptation when the RX FFE and clock data recovery (CDR) are jointly adapted. It is noted that although the present disclosure includes examples relating to a receiver-side FFE (e.g., an RX FFE), it is to be appreciated that the constrained FFE described herein can be employed on the transmitter-side of the communications systems (e.g., a TX FFE).

Embodiments of the present application allow for enhanced noise management performance while controlling a sampling phase relative to a clock data recovery (CDR) settled sample point. According to embodiments, the computation of the constraint function with respect to the key tap value can be performed with an offset (e.g., a programmable constant value) which changes to enable the CDR to sample relative to a nominal sampling point without this offset. As an example, the key filter tap coefficient value can be computed from a linear sum of one or more of the adjusted filter tap coefficient values corresponding to the other filter taps.

FIG. 1A illustrates an example communication system 100 according to at least one example embodiment. The system 100 includes a device 110, a communication network 108 including a communication channel 109, and a device 112. In at least one example embodiment, devices 104 and 112 correspond to one or more of a Personal Computer (PC), a laptop, a tablet, a smartphone, a server, a collection of servers, or the like. In some embodiments, the devices 104 and 112 may correspond to any appropriate type of device that communicates with other devices also connected to a common type of communication network 108. According to embodiments, the receiver 104 of devices 110 or 112 may correspond to a graphics processing unit (GPU), a switch (e.g., a high-speed network switch), a network adapter, a central processing unit (CPU), etc. As another specific but non-limiting example, the devices 104 and 112 may correspond to servers offering information resources, services and/or applications to user devices, client devices, or other hosts in the system 100.

Examples of the communication network 108 that may be used to connect the devices 104 and 112 include an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network 108 is a network that enables data transmission between the devices 104 and 112 using data signals (e.g., digital, optical, wireless signals).

The device 104 includes a transceiver 116 for sending and receiving signals, for example, data signals. The data signals may be digital or optical signals modulated with data or other suitable signal for carrying data.

The transceiver 116 may include a digital data source 120, a transmitter 102, a receiver 104, and processing circuitry 132 that controls the transceiver 116. The digital data generator 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 124 includes suitable software and/or hardware for receiving digital data from the digital data source 120 and outputting data signals according to the digital data for transmission over the communication network 108 to a receiver 104 of device 112. Additional details of the structure of the transmitter 124 are discussed in more detail below with reference to the figures.

The receiver 104 of device 110 and device 112 may include suitable hardware and/or software for receiving signals, for example, data signals from the communication network 108. For example, the receiver 104 may include components for receiving processing signals to extract the data for storing in a memory, as described in detail below with respect to FIG. 1B-FIG. 8.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control overall operation of the transceiver 116.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 120 may include other processing devices, storage devices, and/or communication interfaces generally associated with computing tasks, such as sending and receiving data.

FIG. 1B illustrates a block diagram of an exemplary communication system 100 employing a PAM modulation scheme. In the example shown in FIG. 1, a PAM level-4 (PAM4) modulation scheme is employed with respect to the transmission of a signal (e.g., digitally encoded data) from a transmitter (TX) 102 to a receiver (RX) 104 via a communication channel 106 (e.g., a transmission medium). In this example, the transmitter 102 receives 101 an input data (i.e., the input data at time n is represented as "a(n)"), which is modulated in accordance with a modulation scheme (e.g., PAM4) and sends 103 the signal a(n) including a set of data symbols (e.g., symbols −3, −1, 1, 3, wherein the symbols represent coded binary data). It is noted that while the use of the PAM4 modulation scheme is described herein by way of example, other data modulation schemes can be used in accordance with embodiments of the present disclosure, including for example, a non-return-to-zero (NRZ) modulation scheme, PAM8, PAM16, etc. For example, for a non-return to zero (NRZ)-based system, the transmitted data symbols consist of symbols −1 and 1, with each symbol value representing a binary bit. This is also known as a PAM level-2 or PAM2 system as there are 2 unique values of transmitted symbols. Typically a binary bit 0 is encoded as −1, and a bit 1 is encoded as 1 as the PAM2 values.

In the example shown, the PAM4 modulation scheme uses four (4) unique values of transmitted symbols to achieve higher efficiency and performance. The four levels are denoted by symbol values −3, −1, 1, 3, with each symbol representing a corresponding unique combination of binary bits (e.g., 00, 01, 10, 11).

The communication channel 106 is a destructive medium in that the channel acts as a low pass filter which attenuates higher frequencies more than it attenuates lower frequencies and introduces intersymbol interference (ISI). The communication channel 106 can be over serial links (e.g., a cable, printed circuit boards (PCBs) traces, copper cables, optical fibers, or the like), read channels for data storage (e.g., hard disk, flash solid-state drives (SSDs), high-speed serial links, deep space satellite communication channels, applications, or the like. As described above, the communication channel 106 introduces ISI to the transmitted data at the channel output.

The receiver (RX) 104 includes an FFE (also referred to as the "RX FFE") 108, which is a circuit configured as a transversal filter to compensate for frequency-dependent loss caused by the communication channel 106. Equalizers in the receiver 104 are used to mitigate the effects of ISI. Examples of equalizers are continuous-time linear equalizer (CTLE), sampled data finite impulse response (FIR) filter, decision feed forward equalization (DFFE), or decision feedback equalization (DFE). One or more of these equalizers may be optionally used in the communication system 100. In at least one embodiment, the equalizer in the receiver 104 can mitigate the effects of ISI by sampling the channel output at desirable time instances to properly detect the received data such that the recovered data is error-free or received with a very low error rate.

Accordingly, the receiver 104 compensates for the loss or noise introduced by the channel 106 by performing equalization to recover the transmitted data and establish the received data (i.e., the received data at time n is represented as "v(n)"). The equalization enables the receiver 104 to generate an output 107 of an equalized received signal, including a set of estimated symbol values at time n as v(n). In the example, the RX FFE 108 equalizes the received signal to generate received symbols [v(n)=−3, −1, 1, 3]. Aspects of the receiver 104 and RX FFE 108 (also referred to as a "constrained RX FFE" according to embodiments of the present disclosure are described in greater detail with respect to FIG. 2.

Figure 2:
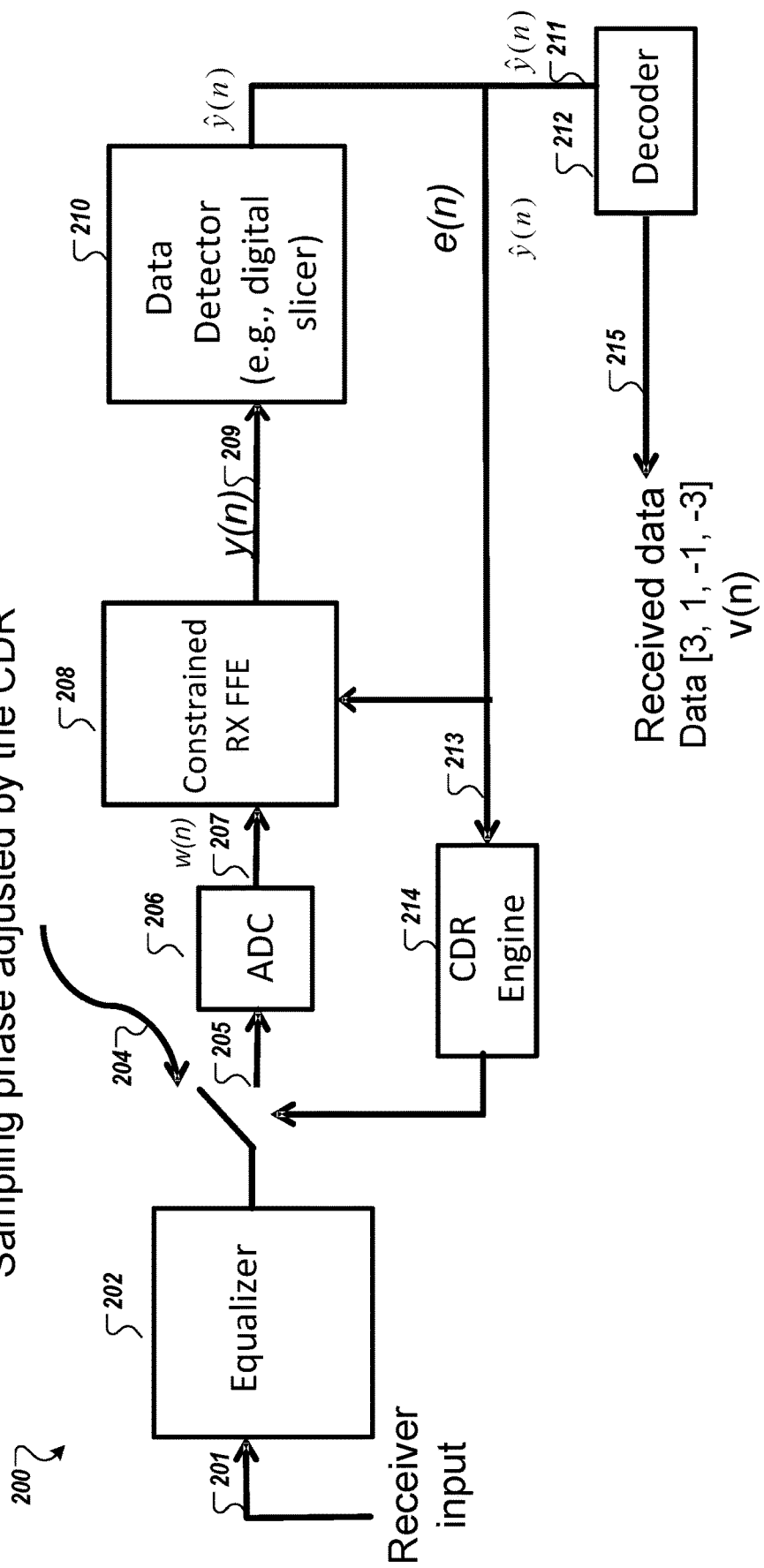
FIG. 2 illustrates an example device including a constrained feed forward equalizer to perform adaptation processing of filter tap coefficients, in accordance with at least some embodiments.

FIG. 2 illustrates an example receiver 204 including a constrained RX FFE 208 to perform adaptation processing of filter tap coefficients in accordance with embodiments of the present disclosure. As shown in FIG. 2, the receiver 204 may include components associated with processing the receiver input to generate the received data v(n). In an embodiment, the receiver 204 includes an equalizer 202, an analog-to-digital converter (ADC) 206, the constrained RX FFE 208, a data detector 210, a decoder 212, and a clock data recovery (CDR) engine 214. Once the transmitted data is passed through the communication channel (e.g., channel 106 of FIG. 1), the receiver 200 process the channel output (i.e., the receiver input) using one or more equalizers (e.g., equalizer 202 and the constrained RX FFE 208) to mitigate the effects of ISI and sample the channel output at desirable time instances to properly detect the received data v(n) such that the recovered data is error-free or recovered with a very low error rate. Example equalizers 202 may include a continuous-time linear equalizer (CTLE), a sampled data finite impulse response (FIR) filter (also known as an RX FFE), or a decision feedback equalizer (DFE).

In the example described herein, equalizer 202 includes a CTLE configured to perform an initial equalization of the received signal (i.e., the receiver input), such as, for example, frequency equalization, gain adjustment, etc. According to embodiments, the CTLE is a linear filter applied at the receiver 200 that attenuates low-frequency signal components, amplifies components around the Nyquist frequency, and filters off higher frequencies. A CTLE gain can be adjusted to optimize the ratio of low-frequency attenuation to high-frequency amplification.

As shown in FIG. 2, data from the equalizer 202 can be sampled using a clock data recovery (CDR) engine 214. In an embodiment, an adaptive loop is established in which samples are taken using a sampling phase 204 adjusted by the CDR engine 214 and passed as an input 205 to the ADC 206 to generate a digital signal (i.e., the digital signal at time n is represented as "w(n)") which is provided as an input 207 to the constrained RX FFE 208 to perform further equalization in the digital domain. In an embodiment, the constrained RX FFE 208 generates an "equalized" output (i.e., the data detector 210 output at time n is represented as "y(n)"), which is provided as an input 209 to the data detector 210.

In an example, the output of the constrained RX FFE 208 at time n (i.e., y(n)) includes the data symbols and all related impairments or noise introduced by the channel (e.g., noise due to the effects of ISI or other noise sources). In an embodiment, the output of the constrained RX FFE 208 can be represented by the following expression:

$$y(n)=a(n)+a(n-1)+q(n);$$  Expression 1 where y(n) is the output at symbol time n, a(n) and a(n−1) are the transmitted data symbols at symbol times n and n−1, respectively, and q(n) is the combination of residual noise and inter symbol interference and other residual impairments at symbol time n. For example, for PAM4 transmitted symbols of a(n, n−1)=−3, −1, 1, 3, y(n) can includes values 6.1, −2.9, 1.2, −5.9, etc. which represent the addition of corresponding PAM4 modulation symbol value a(n) and a(n−1) as impacted by the channel noise (e(n)) in accordance with Expression 1. In an embodiment, the output of the constrained RX FFE 208 is provided to the data detector 210.

In an embodiment, the data detector 210 is configured to perform detection on the signal to recover the actual data that was transmitted. In an embodiment, the data detector 210 is configured to produce detected data bits or symbols (represented as ŷ(n) at time n in FIG. 2). For example, the data detector 210 can include one or more latches which "slice" a voltage at a programmable threshold or an ADC, which produces a multi-bit output from which the data can be detected and from which an estimate of the error (i.e., estimated error at time n is represented e(n)). In another example, the data detector 210 can include a maximum likelihood sequence detector (also known as a Viterbi detector) which can be used in conjunction with a preceding ADC.

In an embodiment, the output of the data detector 210 generates the decision estimates based on the impaired partial response symbols (i.e., y(n)+e(n)) to generate the estimated data symbol (ŷ(n)) and the estimated error component e(n). In an embodiment, the error (e(n)) is the difference between the received symbol (y(n)) and the decision estimate (ŷ(n)), as represented by the following expression:

$$e(n)=y(n)-ŷ(n)$$  Expression 2

In this example, the digital detector 210 performs a slicing operation to convert the y(n)=6.1 to a decision estimate y(n)=6, thereby reflecting a filtered or equalized version of the equalized input signal. In an embodiment, the data detector 210 can be a latch or slicer which slices a voltage at a programmable threshold or an analog to digital converter (ADC), which produces a multi-bit output from which the data can be detected and from which an estimate of the error in the detected data can also be computed. For example, for a received symbol y(n)=6.1 and a decision estimate ŷ(n)=6.0, the error estimate e(n)=0.1. In this example, the data detector 210 converts the noisy received data (equalized data) into discrete detected data ŷ(n) (e.g., −6, −4, −2, 0, 2, 4, 6) and provides a metric of the noise or error level (i.e., e(n)).

As shown in FIG. 2, the ŷ(n) and e(n) are fed back (i.e., feedback loop 213) to the CDR engine 214 for use by the CDR engine 214 to change or adjust the phase of the sampling for the ADC 206. In an embodiment, the data detector 210 outputs ideal (ŷ(n)), actual (y(n)), and error (e(n)) metrics that are fed back via feedback loop 213 to make an adjustment to the sampling via the CDR engine 214 (e.g., by changing the rate of the sampling based on fed back metrics) and/or controlling the adaptation of the filter tap coefficient values of the filter taps of the constrained RX FFE 208, as described in greater detail below.

In an embodiment, the digital detector 210 further provides output 211 to the decoder 212 configured to map the ŷ(n) value (e.g., 6.0 in the example above) to a received data value (e.g., v(n)) in accordance with the applicable modulation scheme. For example, for a PAM4-based modulation scheme, the decoder 212 maps the ŷ(n) value (e.g., −6, −4, −2, 0, 2, 4, 6) to a corresponding receive data value (e.g., −3, −1, 1, 3).

Figure 3:
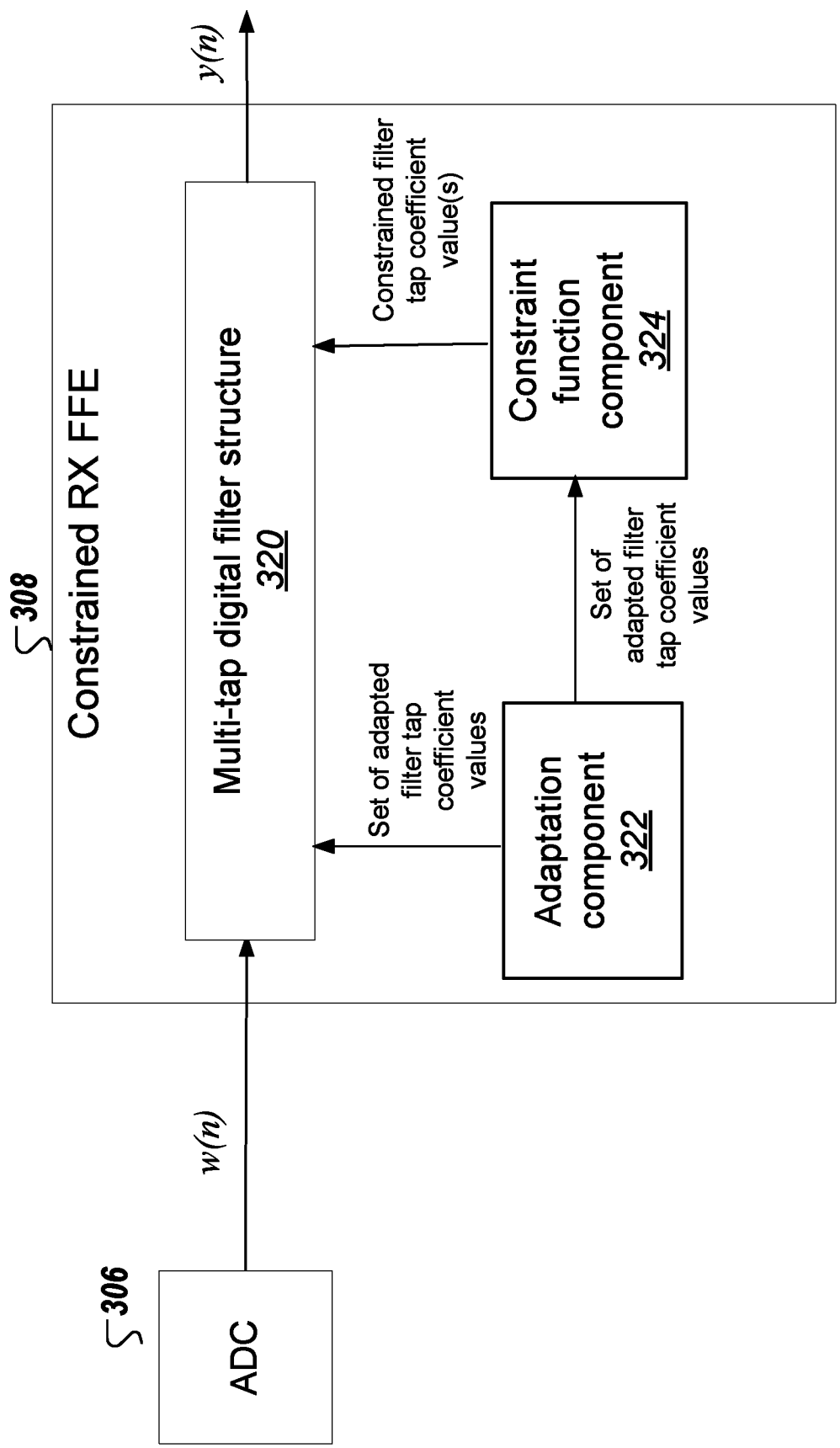
FIG. 3 illustrates an example constrained feed forward equalizer, in accordance with at least some embodiments.

FIG. 3 illustrates an example constrained RX FFE 308 according to embodiments of the present disclosure. As shown in FIG. 3, the constrained RX FFE 308 includes a multi-tap digital filter structure 320, an adaptation component 322, and a constraint function component 324. The multi-tap digital filter structure 320 receives the digital input w(n) (e.g., a multi-bit number) from the ADC 206 and uses a series of filter taps to generate the output (y(n)) of the constrained RX FFE 308. The series of filters are used to "tap" different points in the delay line and weight the tapped values with a corresponding filter tap coefficient value. In an embodiment, the weighted tap values are summed to generate the output (y(n) of the constrained RX FFE 308.

According to embodiments, each filter tap is a two-input multiplier circuit configured to receive a digital signal (e.g., w(n)) and a filter tap weight or coefficient (f(i)) as inputs and multiply those values to generate a filter tap output. In an embodiment, the multi-tap digital filter structure 320 further includes a summation component to sum the respective outputs of the filter taps to generate the output (y(n)) of the constrained RX FFE 308. An example of the multi-tap digital filter structure 320 is described in greater detail below with respect to FIG. 4.

According to embodiments, the adaptation component 322 is configured to execute an adaptation process (e.g., an LMS adaptation process, a ZF adaptation process, etc.) to generate a set of adapted filter tap coefficient values for a portion of the filter taps of the multi-tap digital filter structure 320, as described below in greater detail with respect to FIG. 5. According to embodiments, the constraint function component 324 is configured to compute a constrained filter tap coefficient value using a constraint function based on at least a portion of the set of adapted filter tap coefficient values for a designated or "key" filter tap of the multi-tap digital filter structure 320, as described in greater detail below with respect to FIG. 5.

Figure 4:
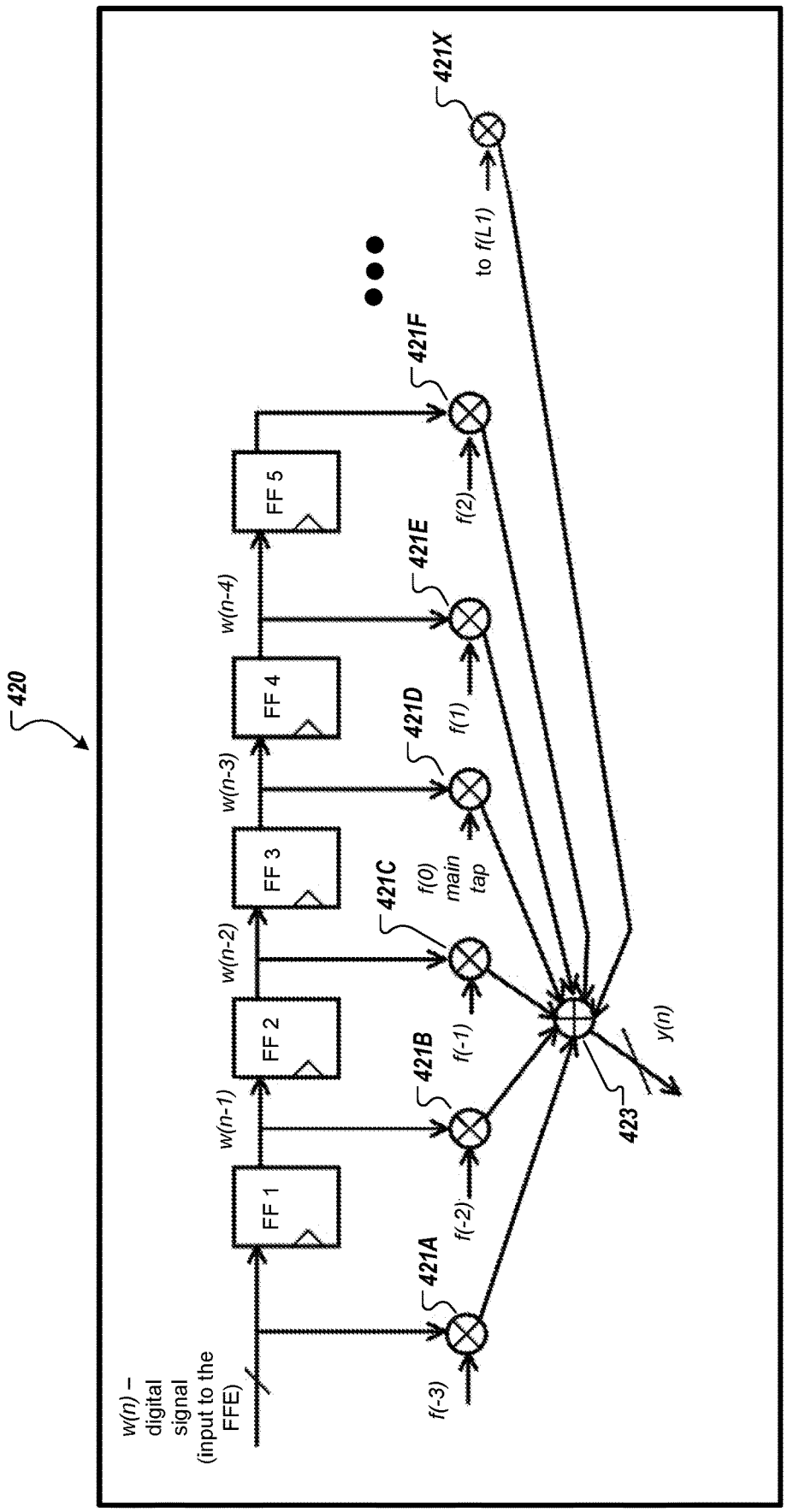
FIG. 4 illustrates a block diagram of an exemplary multi-tap digital filter structure of a constrained feed forward equalizer, in accordance with at least some embodiments.

FIG. 4 illustrates a block diagram of an exemplary multi-tap digital filter structure (e.g., multi-tap digital filter structure 320 of FIG. 3) of the constrained RX FFE (e.g., constrained RX FFE 308 of FIG. 3) according to embodiments of the present disclosure. As shown in FIG. 4, the multi-tap digital filter structure 420 includes a series of filter taps 421A, 421B, 421C, 421D, 421E, 421F . . . 421X. In an embodiment, the series of filter taps of the multi-tap digital filter structure 420 includes a set of "pre-cursor" taps (taps 421A, 421B, and 421C), a set of "post-cursor" taps (taps 421E, 421F . . . 421X), and a main tap (421D). The multi-tap FFE digital filter structure 420 can have any number of post-cursor taps (e.g., where L1 equals the number of post-cursor taps) and any number of pre-cursor taps (e.g., where L2 equals the number of pre-cursor taps). In the example shown in FIG. 4, L2=3 such that there are 3 pre-cursor taps (taps 421A, 421B, and 421C).

As shown in FIG. 4, the multi-tap FFE filter component 420 includes a delay line with a series of flip-flop circuits (FF1, FF2, FF3, etc.) corresponding to respective filter taps (e.g., 421B, 421C, 421D, etc.) It is noted that the first pre-cursor tap (421A) receives the digital signal w(n), which is the input to the constrained RX FFE, and as such, no delay FF is associated with pre-cursor tap 421A. In an embodiment, FF1 of the delay line generates an output of w(n−1) which is provided as an input to pre-cursor tap 421B, FF2 of the delay line generates an output of w(n−2) which is provided as an input to pre-cursor tap 421C, FF3 of the delay line generates an output of w(n−3) which is provided as an input to the main tap 421D, and so on, as illustrated in FIG. 4.

Each filter tap is a two-input multiplier circuit configured to receive a digital signal (e.g., w(n)) and a filter tap weight or coefficient (f) as inputs and multiply those values to generate a filter tap output. In an embodiment, a set of adapted filter tap coefficients are generated by the adaptation component (e.g., the adaptation component 322 of FIG. 3) and provided as inputs f(−3), f(−2), f(−1), f(0), f(2) . . . f(L1). In an embodiment, in the example shown in FIG. 3, tap 421E is designated as the key tap, and its corresponding filter tap coefficient value f(1) is generated by the constraint function component (e.g., constraint function component 324 of FIG. 3). As shown in FIG. 4, the multi-tap digital filter structure 420 includes a summation component 423 to sum the respective outputs of the filter taps to generate the output (y(n)) of the constrained RX FFE (e.g., constrained RX FFE 308 of FIG. 3).

With reference to FIGS. 3 and 4, in an embodiment, the output (y(n)) of the constrained RX FFE is represented by the following expression:

$$y(n)=\sum_{l=-L2}^{l=L1}f(l)w(n-1);  \qquad \text{Expression 3}$$

where f(l) is the RX FFE tap values generated by the adaptation component (e.g., adaptation component 322 of FIG. 3) and constraint function component (e.g., constraint function component 324 of FIG. 3), w(n) is the input to the constrained RX FFE and L2 and L1 represent the number of "pre-cursor" taps and "post-cursor" taps respectively.

Figure 5:
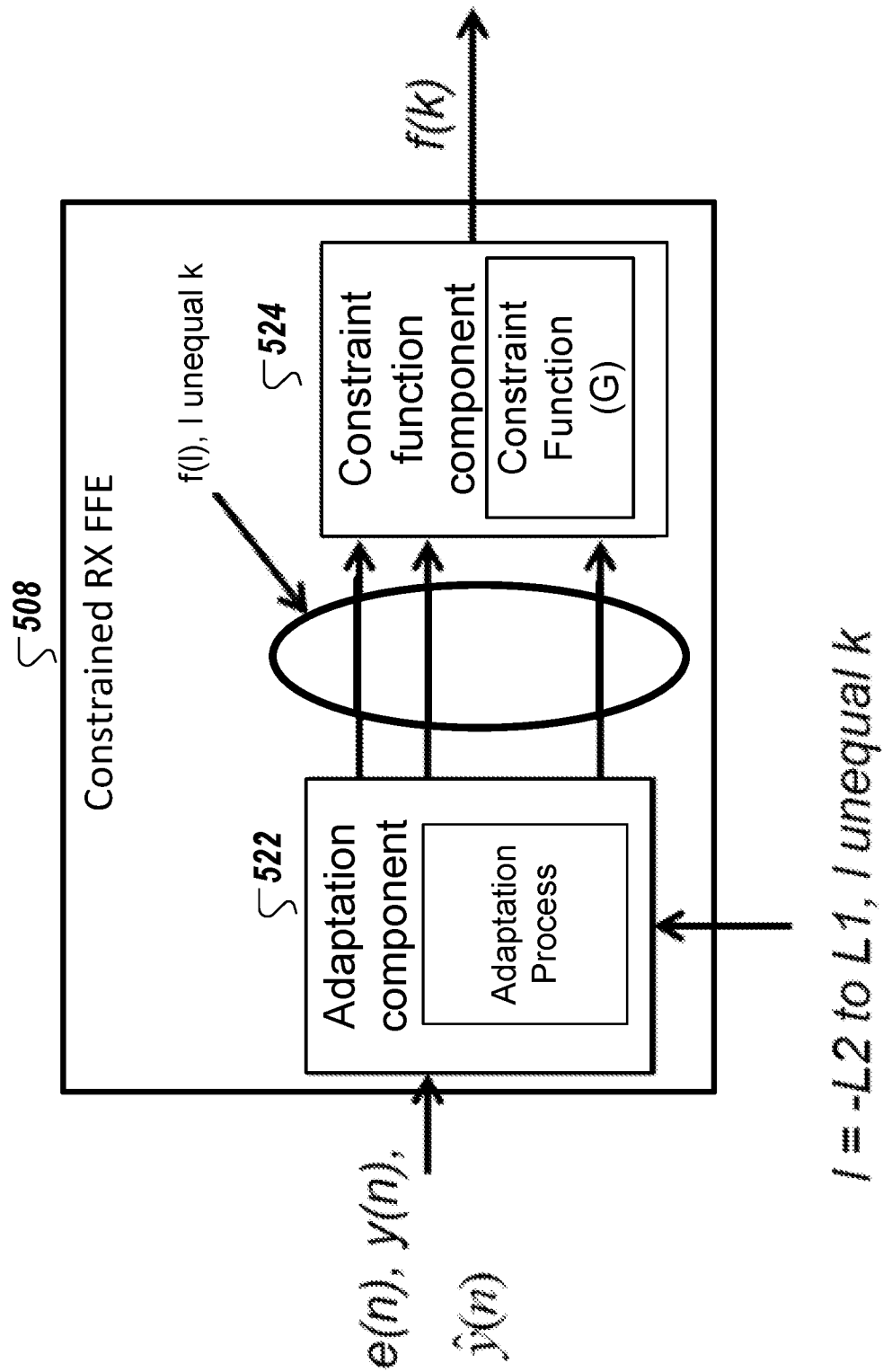
FIG. 5 illustrates an exemplary constrained feed forward equalizer including an adaptation component and a constraint function component, in accordance with at least some embodiments.

FIG. 5 illustrates an exemplary constrained RX FFE 508 including an adaptation component 522 and a constraint function component 524 according to embodiments of the present disclosure. The adaptation component 522 is configured to execute an adaptation process to generate a set of adapted filter tap coefficient values for use by the multi-tap digital filter structure. During the adaptation process, the adaptation component 522 obtains the lth tap at time n−1

(denoted as $f(l,n-1)$) and obtains the lth tap at time n (denoted as $f(n,l)$) from $f(l,n-1)$.

In one embodiment, the adaptation component 522 executes an LMS adaptation process to determine $f(n,l)$, according to the following expression:

$$f(n,l)=f(n-1,l)-\mu*e(n)w(n-l); \quad \text{Expression 4}$$

where $\mu$ is a constant which controls the rate of adaptation of the taps.

In one embodiment, the adaptation component 522 executes a ZF adaptation process to determine f(n,1), according to the following expression:

$$f(n,l)=f(n-1,l)-\mu*e(n)\hat{y}(n-l); \quad \text{Expression 5}$$

where $\mu$ is a constant which controls the rate of adaptation of the taps.

In an embodiment, the adaptation component 522 executes one of the aforementioned adaptation processes (e.g., the LMS adaptation process or the ZF adaptation process) to adapt the filter tap coefficient values for a first set of filter taps of the series of filter taps of the multi-tap digital filter structure. In an embodiment, the first set of filter taps to be adapted by the adaptation component 522 includes the set of taps of the multi-tap digital filter with the exception of one or more designated or key taps. For example, if tap 421E of FIG. 4 is designated as the key tap, then the set of filter tap coefficients values adapted by the adaptation component 522 includes $f(-3)$, $f(-2)$, $f(-1)$, $f(0)$, $f(2)$ . . . $f(L1)$. As illustrated by this example, the filter tap coefficient value ("$f(k)$") associated with key tap (e.g., $f(1)$, where k=1) is not adapted by the adaptation component 522 since $f(1)$ corresponds to the key tap 421E. In some embodiments, one or more taps may be designated as key taps. In these embodiments, the filter tap coefficient values of the one or more key taps are adapted by the adaptation component 524.

In an embodiment, the filter tap coefficient value of the key tap $f(k)$ is adapted or computed by the constraint function component 524. In an embodiment, the constraint function component 524 adapts or computes $f(k)$ based on at least a portion of the set of adapted filter tap coefficients using a constraint function ("$G(x)$").

In an embodiment, the constraint function $G(x)$ can be computed according to the following expression:

$$f(k)=G(f(l)), l=\text{at least a portion of the adjusted filter tap coefficients for taps—L2 to L1}, l \text{ unequal to } k. \quad \text{Expression 6}$$

In an embodiment, $G(x)$ is the constraint function computed based on at least a portion of the set of adapted filter tap coefficients values (e.g., $f(-L2)$ . . . $f(L1)$; not including $f(k)$).

For example, if the key tap is designated as the first post-cursor tap (i.e., k=1), the corresponding filter tap coefficient value ($f(1)$) can be computed by the constraint function component 524 according to the following constraint function expression:

$$f(1)=f(0)+f(-1)-f(2)+fDTarg; \quad \text{Expression 7}$$

where $fDTarg$ is a programmable offset value. In an embodiment, if one or more characteristics of the channel (e.g., channel 106) are known in advance of the adaptation and constraint processing or are determinable in real-time, the $fDTarg$ can be selected based on apriori simulation analysis of channels of various losses. The simulation data can be used to predict a desired or low BER value corresponding to the identified channel loss, and the value of the $fDTarg$ can be selected and programmed to a value which optimizes the BER value. In an embodiment, $fDTarg$ can be optimized by the receiver by sweeping it across an apriori range and measuring a quality metric such as signal to noise ratio (SNR), eye opening metric (EOM) or BER for each value of $fDTarg$ and choosing the value which yields the optimum SNR or BER. Note that varying $fDTarg$ can also shift the sample phase at which the CDR samples in the absence of having any $fDTarg$ applied ($fDTarg=0$). As such, $fDTarg$ can be optimized using an alternative criterion that optimizes the performance of the CDR without a significant negative impact in BER.

In this example, the constraint function component 524 can apply $G(x)$ according to Expression 7 to compute f(k) based on the portion of the set of adapted filter tap coefficient values including $f(0)$, $f(-1)$, and $f(2)$.

It is noted that $fDTarg$ can have a value of 0, such that $f(1)$ can be computed by the constraint function component 524 according to the following constraint function expression:

$$f(1)=f(0)+f(-1)-f(2) \quad \text{Expression 8}$$

In another embodiment, for k=1, the constrained filter tap coefficient value ($f(1)$) can be computed by the constraint function component 524 according to the following constraint function expression:

$$f(1)=f(0)+f(-1)+fDTarg; \quad \text{Expression 9}$$

In this example, the constraint function component 524 can apply $G(x)$ according to Expression 9 to compute $f(k)$ based on the portion of the set of adapted filter tap coefficient values, including $f(0)$ and $f(-1)$.

According to embodiments, the adaptation component 522 executes the adaptation process (e.g., an LMS adaptation process according to Expression 4 above or a ZF adaptation process according to Expression 5 above) to generate a set of adapted filter tap coefficient values for each of the taps including filter tap coefficients $f(l)$ (where l does not equal k) and the constraint function component 524 generates a constrained filter tap coefficient value ($f(k)$) for the designated or key tap using a constraint function ($G(x)$) based on at least a portion of the set of adapted filter tap coefficient values (e.g., at least a portion of $f(-L2)$ to $f(L1)$; not including $f(k)$).

Figure 6:
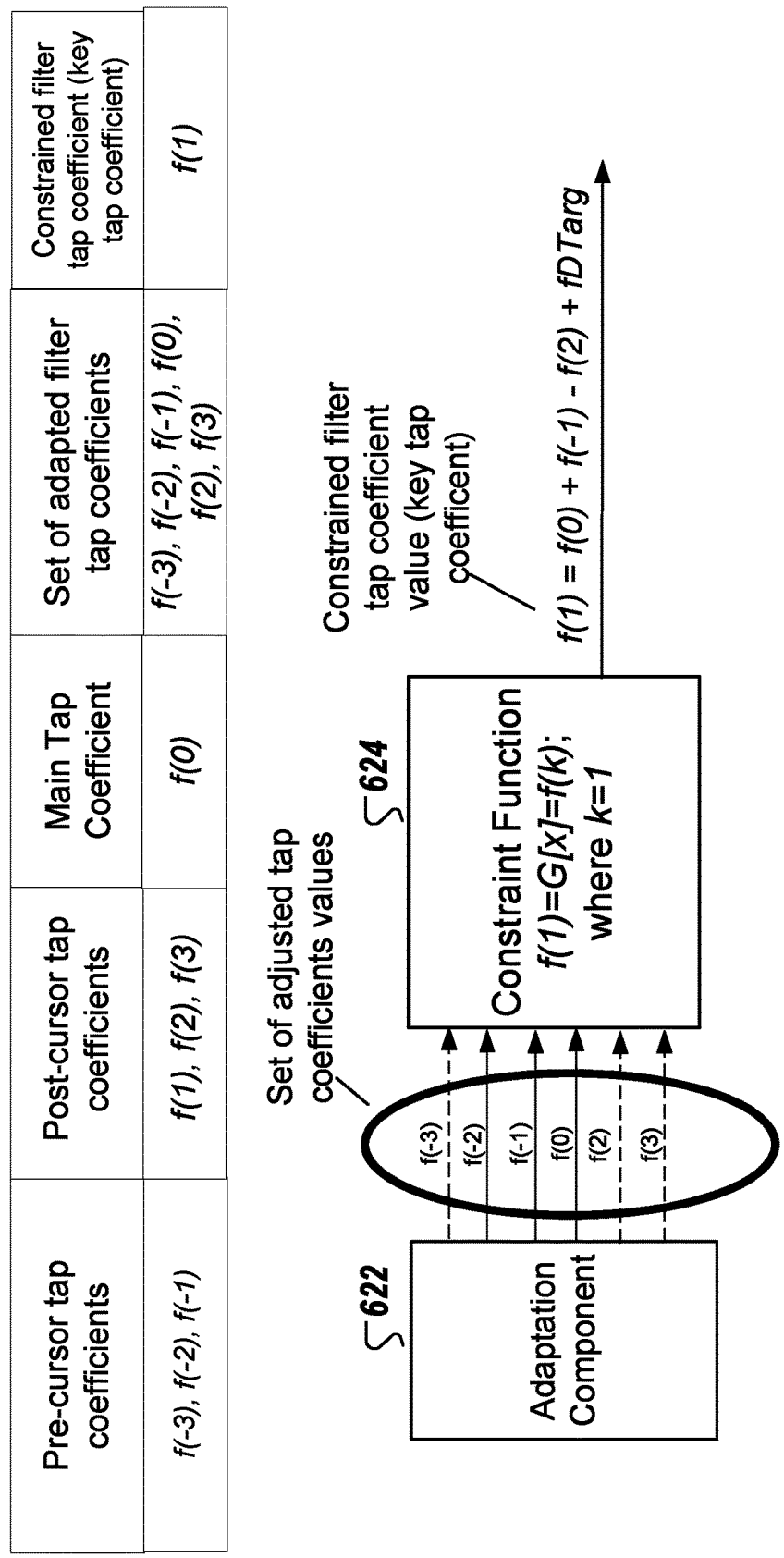
FIG. 6 illustrates an example generation of a set of adapted filter tap coefficient values by an adaptation component and a constrained filter tap coefficient value by a constraint function component for a set of filter taps of a multi-tap digital filter structure, in accordance with at least some embodiments.

FIG. 6 illustrates an example of the generation of a set of adapted filter tap coefficient values by an adaptation component 622 and a constrained filter tap coefficient value by a constraint function component 624 for a set of filter taps of a multi-tap digital filter structure (e.g., multi-tap digital filter structure 320 of FIG. 3 or 420 of FIG. 4). In the example shown in FIG. 6, the multi-tap digital filter structure has a set of L1=3 post-cursor taps and corresponding tap coefficients ($f(1)$, $f(2)$, $f(3)$), a set of L2=3 pre-cursor taps and corresponding tap coefficients ($f(-3)$, $f(-2)$, $f(-1)$), and a main tap associated with tap coefficient $f(0)$.

In this example, the first post-cursor tap having tap coefficient $f(1)$ is designated as the key tap. According to embodiments, the adaptation component 622 generates a set of filter tap coefficient values for the filter taps $f(-3)$, $f(-2)$, $f(-1)$, $f(0)$, $f(2)$, and $f(3)$ using an adaptation process (e.g., the LMS adaptation process or the ZF adaptation process). In this example, the constraint function component 624 receives a portion of the set of adjusted filter tap coefficient values (i.e., $f(0)$, $f(-1)$, and $f(-2)$) to be used in computing $f(1)$ (i.e., the filter tap coefficient corresponding to the key tap) using a constraint function $f(k)=G[x]=f(0)+f(-1)-f(-2)+fDTarg$, where "x" represents the set of adapted filter taps used to compute the key tap. In one embodiment, the main tap ($f(0)$) is fixed and is not adapted.

As illustrated in this example, the filter tap coefficient value $f(1)$ of the key tap is not adapted by the adaptation component 622, but is instead computed using the constraint function based on at least a portion of the set of adapted filter tap coefficient values (i.e., $f(0)$, $f(-1)$, and $(f-2)$). In one embodiment, the filter tap coefficient value $f(1)$ of the key tap is computed in accordance with the constraint function G[x], wherein f(0) is fixed and the one or more other filter tap coefficients (e.g., f(−1), f(−2)) are adapted by the adaptation component 622.

Figure 7:
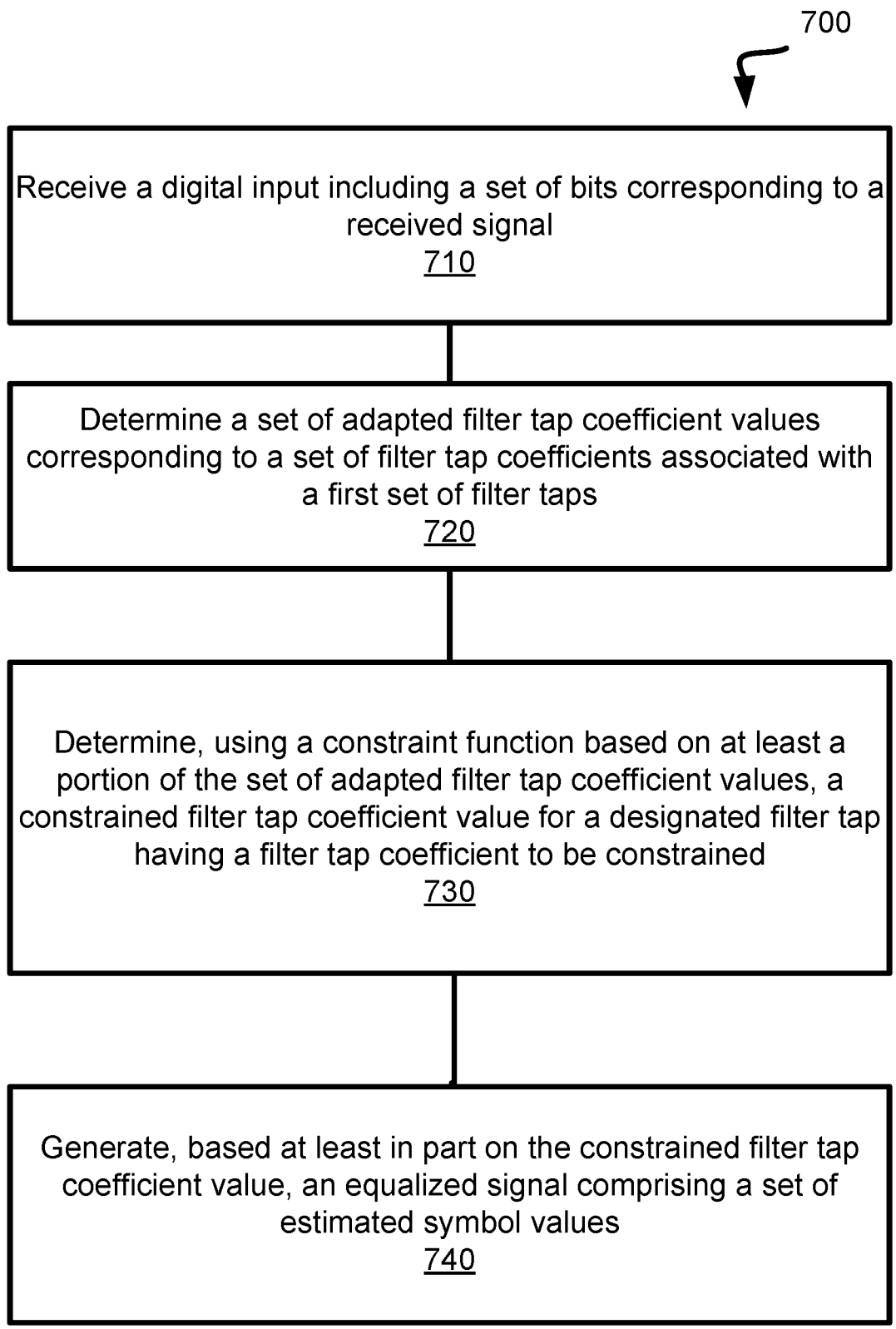
FIG. 7 is a flow diagram of a method of generating an equalized signal based on a set of adjusted filter tap coefficient values and constrained filter tap coefficient value of filter taps of a multi-tap digital filter structure of a receiver in a communication system, in accordance with at least some embodiments.

FIG. 7 is a flow diagram of a method 700 of generating an equalized signal based on a set of adjusted filter tap coefficient values and constrained filter tap coefficient value of filter taps of a multi-tap digital filter structure of a receiver in a communication system. The method 700 can be performed by processing logic comprising hardware, software, firmware, or any combination thereof. In at least one embodiment, the method 700 is performed by the constrained RX FFE 208 of FIG. 2, the constrained RX FFE 308 of FIG. 3, or the constrained RX FFE 508 of FIG. 5. In at least one embodiment, the method 500 is performed by various components of the constrained RX FFE 208, 308, 508, as directed by control logic, which is processing logic in some embodiments. According to embodiments, the method 700 can be performed by a transmitter having an FFE with a multi-tap digital filter, in accordance with the embodiments described herein with reference to a receiver-side FFE and filter. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a digital input including a set of bits corresponding to a received signal. In an embodiment, the processing logic of the constrained RX FFE receives the digital input from an ADC of the receiver. In an embodiment, the received signal is transmitted from a transmitter via a channel of a communication system (e.g., as shown in FIG. 1)

At operation 720, the processing logic determines a set of adapted filter tap coefficient values corresponding to a set of filter tap coefficients associated with a first set of filter taps. In an embodiment, the first set of filter taps includes each of the filter taps of a multi-tap digital filter structure except for a designated key filter tap. In an embodiment, the first set of filter taps includes all of the filter taps of the multi-tap digital filter structure except for the key tap. In an embodiment, the processing logic executes an adaptation process (e.g., the LMS adaptation process or the ZF adaptation process) to determine the set of adapted filter tap coefficient values.

At operation 730, the processing logic determines, using a constraint function based on at least a portion of the set of adapted filter tap coefficient values, a constrained filter tap coefficient value for a designated filter tap having a filter tap coefficient to be constrained. In an embodiment, the filter tap coefficient value for the designated or key filter tap (e.g., $f(1)$ in FIG. 6) is computed based on the portion of the set of adapted filter tap coefficient values (e.g., $f(0)$, $f(-1)$, and $f(-2)$ in the example shown in FIG. 6). It is noted that the constraint function G(x) can be executed by the processing logic to compute the constrained filter tap coefficient value for the designated filter tap based on one or more other portions of the set of adjusted filter tap coefficient values (e.g., $f(0)$ and $f(-1)$ in accordance with the constraint function of Expression 9 above).

At operation 740, the processing logic generates, based at least in part on the constrained filter tap coefficient value, an equalized signal comprising a set of estimated symbol values. In an embodiment, the processing logic uses the constrained filter tap coefficient value and the set of adapted filter tap coefficient values to compute corresponding filter tap outputs (e.g., outputs of the filter taps 421A, 421B, 421C . . . 421X of FIG. 4) to be summed (e.g., by summation component 423 of FIG. 4) to generate the equalized signal y(n).

Figure 8:
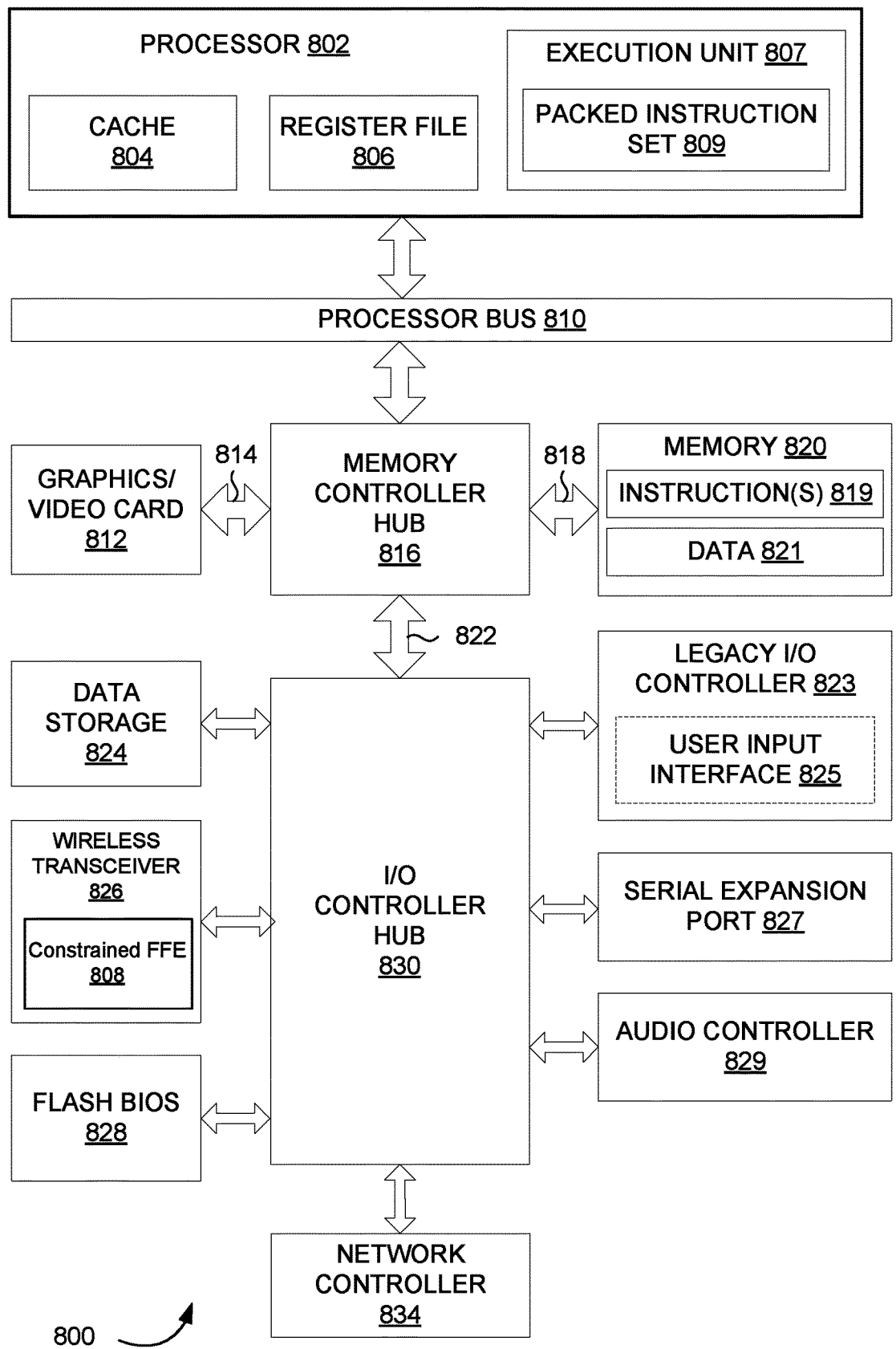
FIG. 8 illustrates an example computer system including a wireless transceiver including a constrained feed forward equalizer, in accordance with at least some embodiments.

FIG. 8 illustrates a computer system 800, in accordance with at least one embodiment. In at least one embodiment, computer system 800 may be a system with interconnected devices and components, an SOC, or some combination. In at least on embodiment, computer system 800 is formed with a processor 802 that may include execution units to execute an instruction. In at least one embodiment, computer system 800 may include, without limitation, a component, such as processor 802 to employ execution units including logic to perform algorithms for processing data. In at least one embodiment, computer system 800 may include processors, such as PENTIUM® Processor family, Xeon™, Itanium®, XScale™ and/or StrongARM™, Intel® Core™, or Intel® Nervana™ microprocessors available from Intel Corporation of Santa Clara, Calif., although other systems (including PCs having other microprocessors, engineering workstations, set-top boxes and like) may also be used. In at least one embodiment, computer system 800 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 800 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 800 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 800 may include, without limitation, processor 802 that may include, without limitation, one or more execution units 807 that may be configured to execute a Compute Unified Device Architecture ("CUDA") (CUDA® is developed by NVIDIA Corporation of Santa Clara, Calif.) program. In at least one embodiment, a CUDA program is at least a portion of a software application written in a CUDA programming language. In at least one embodiment, computer system 800 is a single processor desktop or server system. In at least one embodiment, computer system 800 may be a multiprocessor system. In at least one embodiment, processor 802 may include, without limitation, a CISC microprocessor, a RISC microprocessor, a VLIW microprocessor, a processor implementing a combination of instruction sets, or any other processor device, such as a digital signal processor, for example. In at least one embodiment, processor 802 may be coupled to a processor bus 810 that may transmit data signals between processor 802 and other components in computer system 800.

In at least one embodiment, processor 802 may include, without limitation, a Level 1 ("L1") internal cache memory ("cache") 804. In at least one embodiment, processor 802 may have a single internal cache or multiple levels of internal cache. In at least one embodiment, cache memory may reside external to processor 802. In at least one embodiment, processor 802 may also include a combination of both internal and external caches. In at least one embodiment, a register file 806 may store different types of data in various registers including, without limitation, integer registers, floating point registers, status registers, and instruction pointer register.

In at least one embodiment, execution unit 807, including, without limitation, logic to perform integer and floating point operations, also resides in processor 802. Processor 802 may also include a microcode ("ucode") read only memory ("ROM") that stores microcode for certain macro instructions. In at least one embodiment, execution unit 807 may include logic to handle a packed instruction set 809. In at least one embodiment, by including packed instruction set 809 in an instruction set of a general-purpose processor 802, along with associated circuitry to execute instructions, operations used by many multimedia applications may be performed using packed data in a general-purpose processor 802. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 800 may include, without limitation, a memory 820. In at least one embodiment, memory 820 may be implemented as a DRAM device, an SRAM device, flash memory device, or other memory device. Memory 820 may store instruction(s) 819 and/or data 821 represented by data signals that may be executed by processor 802.

In at least one embodiment, a system logic chip may be coupled to processor bus 810 and memory 820. In at least one embodiment, the system logic chip may include, without limitation, a memory controller hub ("MCH") 816, and processor 802 may communicate with MCH 816 via processor bus 810. In at least one embodiment, MCH 816 may provide a high bandwidth memory path 818 to memory 820 for instruction and data storage and for storage of graphics commands, data and textures. In at least one embodiment, MCH 816 may direct data signals between processor 802, memory 820, and other components in computer system 800 and to bridge data signals between processor bus 810, memory 820, and a system I/O 822. In at least one embodiment, system logic chip may provide a graphics port for coupling to a graphics controller. In at least one embodiment, MCH 816 may be coupled to memory 820 through high bandwidth memory path 818 and graphics/video card 812 may be coupled to MCH 816 through an Accelerated Graphics Port ("AGP") interconnect 814.

In at least one embodiment, computer system 800 may use system I/O 822 that is a proprietary hub interface bus to couple MCH 816 to I/O controller hub ("ICH") 830. In at least one embodiment, ICH 830 may provide direct connections to some I/O devices via a local I/O bus. In at least one embodiment, local I/O bus may include, without limitation, a high-speed I/O bus for connecting peripherals to memory 820, a chipset, and processor 802. Examples may include, without limitation, an audio controller 829, a firmware hub ("flash BIOS") 828, a wireless transceiver 826, a data storage 824, a legacy I/O controller 823 containing a user input interface 825 and a keyboard interface, a serial expansion port 827, such as a USB, and a network controller 834. Data storage 824 may comprise a hard disk drive, a floppy disk drive, a CD-ROM device, a flash memory device, or other mass storage device. In an embodiment, the wireless transceiver 826 includes a constrained FFE 808 (e.g., the constrained RX FFE 108, 208, 308, and 508 of FIGS. 1B, 2, 3, and 5, respectively).

In at least one embodiment, FIG. 8 illustrates a system, which includes interconnected hardware devices or "chips." In at least one embodiment, FIG. 8 may illustrate an exemplary SoC. In at least one embodiment, devices illustrated in FIG. 8 may be interconnected with proprietary interconnects, standardized interconnects (e.g., PCIe), or some combination thereof. In at least one embodiment, one or more components of system 800 are interconnected using compute express link ("CXL") interconnects.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device comprising:
an analog-to-digital converter to generate a digital output comprising a set of bits corresponding to a received signal; and
a feed forward equalizer component comprising:
a plurality of filter taps comprising a first set of filter taps having a first set of filter tap coefficients to be adapted and a second set of one or more filter taps having one or more filter tap coefficients to be constrained;
an adaptation component to:
receive the digital output; and
determine a set of adapted filter tap coefficient values corresponding to the first set of filter tap coefficients; and
a constraint function component to:
determine a constrained filter tap coefficient value for the second set of the one or more filter taps having the one or more filter tap coefficients to be constrained using a constraint function based on at least a portion of the set of adapted filter tap coefficient values, wherein the constraint function determines the constrained filter tap coefficient value based at least in part on:
adding a first adapted filter tap coefficient value of the set of adapted filter tap coefficient values corresponding to a first filter tap and a second adapted filter tap coefficient value of the set of adapted filter tap coefficient values corresponding to a second filter tap; and
subtracting a third adapted filter tap coefficient value of the set of adapted filter tap coefficient values corresponding to a third filter tap; and
generate, based at least in part on the constrained filter tap coefficient value, an equalized signal comprising a set of estimated symbol values.

2. The device of claim 1, wherein the equalized signal is further based on the set of adapted filter tap coefficient values.

3. The device of claim 1, wherein the adaptation component determines the set of adapted filter tap coefficient values based on a least-mean-square (LMS) adaptation process.

4. The device of claim 1, wherein the adaptation component determines the set of adapted filter tap coefficient values based on a zero-forcing (ZF) adaptation process.

5. The device of claim 1, wherein the plurality of filter taps are organized in a sequence comprising a set of pre-cursor filter taps, a main filter tap, and a set of post-cursor filter taps, wherein the second set of the one or more filter taps comprises a first post-cursor tap in a set of post-cursor taps following the main filter tap.

6. The device of claim 1, wherein the first filter tap comprises the main filter tap, the second filter tap comprises a first pre-cursor filter tap of the set of pre-cursor filter taps, and the third filter tap comprises a second post-cursor filter tap of the set of post-cursor filter taps.

7. The device of claim 1, wherein the constrained filter tap coefficient value is further based on adding a constant offset value.

8. The device of claim 1, wherein the constraint function determines the constrained filter tap coefficient value based at least in part on adding a first adapted filter tap coefficient value of the set of adapted filter tap coefficient values corresponding to a first filter tap and a second adapted filter tap coefficient value of the set of adapted filter tap coefficient values corresponding to a second filter tap.

9. The device of claim 8, wherein the first filter tap comprises the main filter tap and the second filter tap comprises a first pre-cursor filter tap, and wherein the constrained filter tap coefficient value is further based on adding a constant offset value.

10. A feed forward equalizer comprising:
a plurality of filter taps comprising a set of filter taps to be adapted and a designated filter tap to be constrained;
an adaptation component to:
determine a set of adapted filter tap coefficient values corresponding to the set of filter taps to be adapted; and
a constraint function component to determine a constrained filter tap coefficient value for the designated filter tap using a constraint function based on at least a portion of the set of adapted filter tap coefficient values, wherein execution of the constraint function comprises:
adding a first adapted filter tap coefficient value of the set of adapted filter tap coefficient values corresponding to a first filter tap and a second adapted filter tap coefficient value of the set of adapted filter tap coefficient values corresponding to a second filter tap; and
subtracting a third adapted filter tap coefficient value of the set of adapted filter tap coefficient values corresponding to a third filter tap;
wherein an equalized signal is generated based at least in part on the set of adapted filter tap coefficient values and the constrained filter tap coefficient value.

11. The feed forward equalizer of claim 10, wherein the adaptation component determines the set of adapted filter tap coefficient values based on one of a least-mean-square (LMS) adaptation process or a zero-forcing (ZF) adaptation process.

12. The feed forward equalizer of claim 10, wherein the plurality of filter taps are organized in a sequence comprising a set of pre-cursor filter taps, a main filter tap, and a set of post-cursor filter taps, wherein the designated filter tap comprises a first post-cursor filter tap in the set of post-cursor filter taps following the main filter tap.

13. The feed forward equalizer of claim 10, wherein the first filter tap comprises the main filter tap, the second filter tap comprises a first pre-cursor filter tap of the set of pre-cursor filter taps, and the third filter tap comprises a second post-cursor filter tap of the set of post-cursor filter taps.

14. The feed forward equalizer of claim 13, wherein the constrained filter tap coefficient value is further based on adding a constant offset value.

15. The feed forward equalizer of claim 10, wherein the constraint function determines the constrained filter tap coefficient value based at least in part on adding a first adapted filter tap coefficient value of the set of adapted filter tap coefficient values corresponding to a first filter tap and a second adapted filter tap coefficient value of the set of adapted filter tap coefficient values corresponding to a second filter tap.

16. The feed forward equalizer of claim 15, wherein the first filter tap comprises the main filter tap and the second filter tap comprises a first pre-cursor filter tap, and wherein the constrained filter tap coefficient value is further based on adding a constant offset value.

17. A method comprising:
   determining, based on a signal, a set of adapted filter tap coefficient values corresponding to a set of filter taps to be adapted of a plurality of filter taps of a multi-tap filter structure;
   determining a constrained filter tap coefficient value for a designated filter tap using a constraint function based on at least a portion of the set of adapted filter tap coefficient values, wherein the designated filter tap comprises a first post-cursor filter tap of the plurality of filter taps, wherein execution of the constraint function comprises:
      adding a first adapted filter tap coefficient value of the set of adapted filter tap coefficient values corresponding to a first filter tap and a second adapted filter tap coefficient value of the set of adapted filter tap coefficient values corresponding to a second filter tap; and
      subtracting a third adapted filter tap coefficient value of the set of adapted filter tap coefficient values corresponding to a third filter tap; and
   generating an equalized signal based at least in part on the set of adapted filter tap coefficient values and the constrained filter tap coefficient value.

* * * * *